(12) United States Patent
Ishimura

(10) Patent No.: US 8,810,123 B2
(45) Date of Patent: Aug. 19, 2014

(54) DC-DRIVEN ELECTROLUMINESCENCE DEVICE AND LIGHT EMISSION METHOD

(75) Inventor: Takuyoshi Ishimura, Yamaguchi (JP)

(73) Assignee: Kohundo Printing Company Ltd., Yamaguchi (JP)

(*) Notice: Subject to any disclaimer, the term of this patent is extended or adjusted under 35 U.S.C. 154(b) by 260 days.

(21) Appl. No.: 13/240,627

(22) Filed: Sep. 22, 2011

(65) Prior Publication Data

US 2012/0068620 A1    Mar. 22, 2012

Related U.S. Application Data

(63) Continuation of application No. PCT/JP2010/060330, filed on Jun. 18, 2010.

(51) Int. Cl.
*H01J 1/62* (2006.01)

(52) U.S. Cl.
USPC ........... 313/483; 313/491; 313/494; 313/502; 313/512

(58) Field of Classification Search
USPC ......... 313/483–487, 491, 494–496, 502–504, 313/512; 257/79, 81, 84, 86, 88, 103, 99, 257/100; 315/169.1–169.4
See application file for complete search history.

(56) References Cited

U.S. PATENT DOCUMENTS

| | | | |
|---|---|---|---|
| 7,462,883 B2 * | 12/2008 | Kumaki et al. | 257/103 |
| 2003/0168665 A1 | 9/2003 | Kim et al. | |
| 2007/0159073 A1 | 7/2007 | Sakanoue et al. | |

FOREIGN PATENT DOCUMENTS

| | | | |
|---|---|---|---|
| EP | 2187442 A2 | 5/2010 |
| JP | S60-134278 A | 7/1985 |
| JP | 05-074572 A | 3/1993 |
| JP | H10-214044 A | 8/1998 |
| JP | 2001-308382 A | 11/2001 |
| JP | 2005-285401 A | 10/2005 |
| JP | 2006-004658 A | 1/2006 |
| JP | 2007-123220 A | 5/2007 |
| JP | 2007-194194 A | 8/2007 |
| JP | 2008-007755 A | 1/2008 |
| JP | 2009-224136 A | 10/2009 |
| JP | 2009-266551 A | 11/2009 |
| JP | 2010-135259 A | 6/2010 |

OTHER PUBLICATIONS

International Search Report issued in PCT/JP2010/060330, mailed on Jul. 13, 2010 (2 pages).
Extended European Search Report issued in European Application No. 10773525.0, mailed on May 2, 2013 (6 pages).

(Continued)

*Primary Examiner* — Tuyet Thi Vo
(74) *Attorney, Agent, or Firm* — Osha Liang LLP

(57) ABSTRACT

An inorganic electroluminescence device has a structure including a phosphor layer sandwiched between a first electrode and a second electrode; and a semiconductor structure in which N-type semiconductors and a P-type semiconductor, made of inorganic semiconductor materials, are joined to form an NPN type structure. The phosphor is made of an inorganic substance. The first electrode is to be a cathode and is formed on an insulating glass substrate. The second electrode is to be an anode and is disposed opposite the first electrode. The semiconductor structure is disposed between the cathode that is the first electrode and the phosphor layer.

6 Claims, 9 Drawing Sheets

(56) References Cited

OTHER PUBLICATIONS

Office Action issued in Japanese Application No. 2010-536262, mailed on Nov. 2, 2010, and English translation thereof (8 pages).
Malcolm H. Higton: High-Contrast Thin-Film/PowerComposite DCEL Devices, Phosphor Products Co., Ltd., Poole, England, 5 pages, 1984.
Jacques L.Pankove: A New Electroluminescent Display Device, Journal of Luminescence 40&41(1988)97-99, North-Holland, Amsterdam, 3 pages.
Hironaga Matsumoto, Shinichi Tanaka, Tadaichi Yabumoto: DC Electroluminescence on M-I-S Structures in Thin Films, Japanese Journal of Applied Physics vol. 17, No. 9, Sep. 1978, pp. 1543-1548, 6 pages.

* cited by examiner

DC-DRIVEN ELECTROLUMINESCENCE DEVICE AND LIGHT EMISSION METHOD

CROSS-REFERENCE TO RELATED APPLICATIONS

This application is a continuation application of International Patent Application No. PCT/JP2010/60330 filed on Jun. 18, 2010.

BACKGROUND OF INVENTION

1. Field of the Invention

The present invention relates to an inorganic electroluminescence device for converting electricity to light by making use of a phenomenon called inorganic electroluminescence and using an inorganic substance as a luminescence material, and also relates to a light emitting device and a light emission method that makes use of the inorganic electroluminescence device.

2. Background Art

Representative examples of self-luminescent devices from which surface emission can be obtained include organic electroluminescence devices (may also be referred to hereinafter as "organic EL devices") and inorganic electroluminescence devices (may also be referred to hereinafter as "inorganic EL devices"). An organic EL device has problems of having a short life and being weak against high temperature because an electric current is made to flow through an organic substance. Although in contrast, an inorganic EL device has several advantageous characteristics, such as being operable in a wide temperature range, having a long life, etc., and numerous studies have been carried out toward practical implementation, many of these studies concern excited luminescence by an AC power supply. Thus, in order to avoid demerits of an AC-excited EL device, a device with which luminescence can be obtained by DC drive has been strongly desired.

With an inorganic EL device, a sulfide-based phosphor material is frequently used, and the method for driving the device is, in most cases, driving by AC or a bipolar pulse voltage. This inorganic EL device has a structure in which a phosphor layer 23 is formed by forming a thin film of the phosphor material above a glass substrate 21 by a vapor deposition method, sandwiching the phosphor layer 23 from above and below by insulating layers 25, and further sandwiching with a lower transparent electrode 22 and an upper back surface electrode 24 as shown in FIG. 14. A DC current thus does not flow, and luminescence is obtained by applying an AC voltage of approximately 100 Hz to 10 kHz from an AC power supply 26. In a first half-cycle of the applied voltage, electrons are accelerated and collided with luminescent centers to cause luminescence inside the phosphor, and in the subsequent inverted half-cycle, the electrons are accelerated in an opposite direction and collided with the luminescent centers to cause luminescence again. Thus, in luminescence by AC, luminescence is made to occur twice within a single cycle but not in a continuous manner. If the EL phenomenon can be made to occur continuously, it may be possible to improve luminescence efficiency and obtain a stronger luminescence. Thus, in order to obtain steady luminescence, the luminescence device must be driven by a DC power supply and thereby be supplied constantly with electrons. A DC-driven inorganic EL device was first presented as a dispersion type EL device in 1968, and thin film type DC-driven EL devices prepared by vacuum vapor deposition methods came to be studied from the 1970s. Although numerous studies have been conducted on this DC-driven EL device, a practical device has yet to be developed because it is weak in luminescence and short in life. In a basic structure of a conventional, DC-driven EL device, the phosphor is sandwiched directly between the transparent electrode and the back surface metal electrode. The phosphor and the electrodes are put in direct contact because charges from the electrodes must be injected directly into the phosphor to make a DC current flow in the interior of the phosphor. However, this structure has a property of unstable current flow, with a current flowing suddenly at a certain voltage or higher, and this tends to cause breakdown of the device.

Thus, in a conventional DC-driven inorganic EL device, a structural modification such as that shown in FIG. 15 is made (Non-Patent Document 1). The DC-driven inorganic EL device shown in FIG. 15 has an arrangement where a DC power supply 28 is connected to the lower transparent electrode 22 installed on the glass substrate 21 and the upper back surface electrode 24, and a stabilizing layer 27 is inserted between the phosphor layer 23 and the upper back surface electrode 24. By providing the stabilizing layer 27, the current that flows is restricted and stabilization of the device is achieved. However, with this structure, the film thickness must be set to approximately several pm to several dozen μm to appropriately restrict the current. Peeling of the thin film and other problems thus occur during manufacture, and restrictions are placed in regard to the materials that can be used. Forming of a thin film of $Ta_2O_5$, $SiO_2$, or other insulator with a thickness of several dozen nm to several μm by vapor deposition and passing of a current through this film have thus been examined (Non-Patent Documents 2 and 3). Although it has thus become possible to prepare a DC EL device that emits light of considerably high luminance, the level of practical use has yet to be reached in regard to device stability and life.

There has also been proposed an arrangement in which a dielectric insulator, having a metal impurity dispersed therein, is introduced as a thin film to achieve stabilization by passing of current through an impurity level (Patent Document 1). With this arrangement, a $BaTiO_3$ dielectric insulator, having yttrium (Y) dispersed and mixed therein, is used as a resistor. However, this arrangement has problems in terms of stability and life.

Meanwhile, there are inventions of inorganic EL devices that make use of the same luminescence principle as an organic EL device (Patent Documents 2 and 3). The devices according to these inventions can be driven by a DC power supply, and with these devices, holes from a positive electrode are injected into the interior of a phosphor layer through a charge transport layer and electrons from a negative electrode are injected through an electron injection layer. Here, a recombination type phosphor is used, and luminescence is obtained by recombination of holes and electrons inside the phosphor layer via an impurity lever in the interior of the phosphor.

In another thin-film EL device, holes are injected into the interior of a phosphor through a P-type semiconductor and electrons are injected through an N-type semiconductor. Luminescence is then obtained by recombination of the holes and electrons inside the phosphor (Patent Document 4). The devices disclosed in Patent Documents 2, 3, and 4 are inorganic EL devices that are driven by DC power supplies and are charge injection type EL devices. Luminescence is obtained by injecting electrons and holes into the interior of the phosphor and making the electrons and holes recombine. A recombination type phosphor is used as the phosphor, and recombination luminescence via the impurity level in the interior of the phosphor is used. However, issues still remain in regard to luminescence efficiency and life.

There has also been proposed a dispersion-type, DC-driven inorganic EL device with which a phosphor, having zinc sulfide as a host material and having a powder of a metal dispersed and mixed therein, is sandwiched by two electrodes (Patent Document 5). The device disclosed in Patent Document 5 is a device in which charges are directly injected from the electrodes into the powder in the phosphor and is basically a dispersion type EL device that has been present from before.

Patent Document 1: Japanese Published Unexamined Patent Application No. H5-74572
Patent Document 2: Japanese Published Unexamined Patent Application No. 2006-4658
Patent Document 3: Japanese Published Unexamined Patent Application No. 2007-123220
Patent Document 4: Japanese Published Unexamined Patent Application No. 2009-224136
Patent Document 5: Japanese Published Unexamined Patent Application No. 2008-7755
Non-Patent Document 1: M. Higton: Digest of 1984 SID International Symposium (1984) 29
Non-Patent Document 2: H. Matsumoto et al.: Jpn. J. Appl. Phys. 17 (1978) 1543
Non-Patent Document 3: J. I. Pankove: J. Lumin. 40&41 (1988) 97

SUMMARY OF INVENTION

As mentioned above, with luminescence by AC in a thin-film inorganic EL device, luminescence occurs twice in a single cycle and is not continuous, and an external circuit is complex due to the AC drive. There is also a demerit in that high luminescence efficiency cannot be obtained due to luminescence occurring twice in a single AC cycle. If the EL phenomenon can be made to occur in a continuous manner, there is a possibility of obtaining a stronger luminescence. Thus, to obtain steady luminescence, it is necessary to drive an EL light emitting device by a DC power supply to supply electrons into a phosphor constantly and continuously.

Embodiments of the present invention have been made to resolve issues of the conventional art, and one or more embodiments provide a collisional excitation type inorganic EL device and light emission method that enable strong, stable luminescence and enable driving by a DC power supply.

In one or more embodiments of the claimed invention, a DC-driven inorganic electroluminescence device has a structure where a phosphor layer, made of an inorganic substance, is sandwiched between a first electrode, which is to be a cathode and is formed on an insulating glass substrate, and a second electrode, which is to be an anode and is disposed opposite the first electrode, and having, between the cathode that is the first electrode and the phosphor layer, a semiconductor structure in which N-type semiconductors and a P-type semiconductor, made of inorganic semiconductor materials, are joined to form an NPN type structure. With the DC-driven inorganic electroluminescence device of the above arrangement, a forward direction voltage is applied to a so-called PN junction of the N-type semiconductor at the cathode side and the P-type semiconductor to provide an action of injecting electrons into an interior of the P-type semiconductor. Also, a PN junction, formed of the N-type semiconductor at the phosphor layer side and the P-type semiconductor, is reverse-biased to provide an action of forming a depletion layer and accelerating the electrons.

In one or more embodiments of the claimed invention, in the DC-driven inorganic electroluminescence device, the phosphor layer is formed of a film in which luminescent centers or a fluorescent substance are or is dispersed and mixed in the N-type semiconductor material.

In one or more embodiments of the claimed invention, in a DC-driven inorganic electroluminescence device, the material of the N-type semiconductor at the cathode side in the semiconductor structure joined to form the NPN type structure in the first or second aspect of the invention is made of an oxide, sulfide, phosphide, nitride, or selenide of Zn, Ba, Sr, Cd, Ga, Sn, In, Ti, Al, Mg, or Gd, or a mixture of these compounds.

In or more embodiments of the claimed invention, the material of the P-type semiconductor present in a middle of the semiconductor structure joined to form the NPN type structure in any of the above mentioned embodiments is made of an oxide, sulfide, or selenide of Ni, Mn, Cr, Co, Cu, Ag, La, Pr, Al, Sr, Ba, Ga, or Sn, or a mixture of these compounds. Also, a compound semiconductor, such as ZnO, ZnS, etc., may be made into a P-type substance by doping of an impurity. The device is satisfactory in performance as long as a vapor-deposited thin film expresses a P-type property as a semiconductor.

Further, in one or more embodiments of the claimed invention, the material of the N-type semiconductor adjacent the phosphor layer in the semiconductor structure joined to form the NPN type structure in any of the above mentioned embodiments of the claimed invention is made of an oxide, sulfide, phosphide, nitride, or selenide of Zn, Ba, Sr, Cd, Ga, Sn, In, Ti, Al, Mg, or Gd, or a mixture of these compounds.

In one or more embodiments of the claimed invention, a dispersion resistance layer, disposed between the first electrode and the second electrode and formed as a thin film of a resistor substance containing an inorganic compound made of at least one type of substance selected from among Ta, Hf, Ti, Nd, Mo, Sn, Zn, Si, Al, and B, is included in any of the first to fifth aspects of the invention. The DC-driven inorganic electroluminescence device thus arranged provides an action of dispersion of current between the first electrode and the second electrode by the dispersion resistance layer and an action of uniform application of an electric field on a surface of the inorganic electroluminescence device.

One or more embodiments of the claimed invention includes the steps of preparing an NPN-type three-layer structure using first and second N-type semiconductors and a P-type semiconductor in an interior of the device, applying a forward direction voltage to a PN junction portion, made up of the first N-type semiconductor at a cathode side and the P-type semiconductor in the NPN-type three-layer structure, to inject electrons into the P-type semiconductor, and further reverse-biasing a PN junction portion made up of the P-type semiconductor and the second N-type semiconductor to form a depletion layer in the PN junction portion and using the electric field in the depletion layer portion to accelerate the electrons injected through the P-type semiconductor and make the electrons collide with luminescent centers or a fluorescent substance dispersed or mixed in a phosphor layer adjacent the second N-type semiconductor and thereby emit light.

By the DC-driven inorganic electroluminescence device and light emission method according to one or more embodiments of the claimed invention, the semiconductor structure joined to form the NPN-type structure is provided, and thus electrons can be accelerated to excite and make the phosphor layer emit light even when a DC power supply is connected.

Also, by employing materials made of inorganic substances, the DC-driven inorganic electroluminescence device can be made long in life.

Other aspects and advantages of the invention will be apparent from the following description and the appended claims.

DETAILED DESCRIPTION

Figure 1:
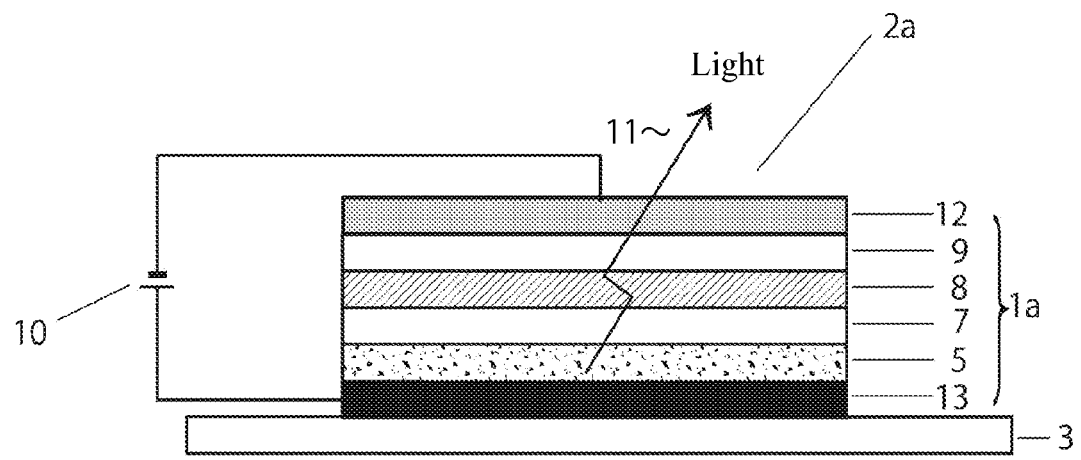
FIG. 1 is a sectional structural view of a DC-driven inorganic electroluminescence device according to a first embodiment of the claimed invention.

A first embodiment of a DC-driven inorganic electroluminescence device and light emission method according to the present invention shall now be described with reference to FIG. 1. FIG. 1 is an arrangement diagram of the DC-driven inorganic electroluminescence device according to the present embodiment. In FIG. 1, a DC-driven inorganic electroluminescence light emitting device 2a includes the inorganic electroluminescence device 1a disposed on a glass substrate 3 and a DC power supply 10 connected thereto. The DC-driven inorganic electroluminescence device 1a is made up of a lower anode 13 disposed on the glass substrate 3, a phosphor layer 5 installed on an upper surface of the lower anode 13, an acceleration layer 7 (N-type semiconductor layer), a P-type semiconductor layer 8, and an N-type semiconductor layer 9 arranged on an upper surface of the phosphor layer 5, and an upper cathode 12 formed on an upper surface of the N-type semiconductor layer 9. Further, the DC power supply 10 is connected to the lower anode 13 and the upper cathode 12 of the DC-driven inorganic electroluminescence device 1a, with a cathode (positive electrode) and an anode (negative electrode) of the DC power supply 10 being connected to the lower anode 13 and an upper cathode 12, respectively.

With the inorganic electroluminescence device 1a shown in FIG. 1, an electroluminescence device is arranged in which an NPN junction structure is formed in an interior of the electroluminescence device by the acceleration layer 7, the P-type semiconductor layer 8, and the N-type semiconductor layer 9, and the phosphor layer 5 is formed by vapor deposition of a phosphor substance below the junction. Using this structure, a forward direction voltage is applied to a PN junction formed by the N-type semiconductor layer 9 at the anode (negative electrode) side of the DC power supply 10 and the P-type semiconductor layer 8 and thereby injecting electrons from the upper cathode 12 into an interior of the P-type semiconductor layer 8 through the N-type semiconductor layer 9. Further, by reverse-biasing a PN junction portion formed by the P-type semiconductor layer 8 and the acceleration layer 7 that is an N-type semiconductor, electrons are accelerated using an electric field of a depletion layer that spreads in the PN junction portion and made to collide with luminescent centers or phosphor in the phosphor layer 5 to obtain a luminescence 11. With the present invention, it has become possible to provide a luminescence device having a new structure by examination of a method for injecting electrons into a phosphor substance and a method for accelerating the electrons.

With the structure of the inorganic electroluminescence device 1a, the phosphor layer 5 is formed by vapor depositing the phosphor to a thickness of 100 nm to 10 μm on the glass substrate 3 on which the lower anode 13 has been formed as shown in FIG. 1. On an upper surface of this film, a layer of pure host material is additionally formed from the same host substance as that of the phosphor of the phosphor layer 5 to form the N-type semiconductor acceleration layer 7 to a thickness of 100 nm to 10 μm. A P-type semiconductor substance is then vapor deposited to a thickness of 10 nm to 10 μm to form the P-type semiconductor layer 8 and thereby form the PN junction with the host material of the acceleration layer 7. An N-type semiconductor substance is then vapor deposited further above to a thickness of 100 nm to 10 μm as the N-type semiconductor layer 9 and thereby form the NPN type structure with the acceleration layer 7, the P-type semiconductor layer 8, and the N-type semiconductor layer 9. Lastly, the upper cathode 12 is vacuum vapor deposited, and the inorganic electroluminescence device 1a is thereby completed. This is the basic form of one or more embodiments according to the present invention.

A phosphor substance, which is generally a compound semiconductor, expresses properties of an N-type semiconductor when formed to a thin film, and thus, a thin film of the same host material as the phosphor is formed as an N-type semiconductor. The PN junction is consequently formed between the upper P-type semiconductor layer 8 that is vapor deposited next and the N-type host material thin film (acceleration layer 7). When this PN junction portion is reverse-biased, the depletion layer spreads in the acceleration layer 7 and the P-type semiconductor layer 8 at this portion. By injecting electrons into this portion in this state, accelerating the electrons using the depletion layer, which is an internal electric field, and making the electrons collide with the luminescent centers contained in the phosphor layer 5, the luminescence 11 is obtained. In regard to the method for injecting electrons into the depletion layer, when a forward direction voltage is applied to the PN junction portion formed by the P-type semiconductor layer 8 and the upper N-type semiconductor layer 9, a forward direction current flows and electrons can thereby be injected into the P-type semiconductor layer 8. The electrons diffuse inside the P-type semiconductor layer 8 and consequently, the electrons can be injected into the internal electric field of the reverse bias depletion layer. The electrons are accelerated by the internal electric field and collide with and excite the luminescent centers in the phosphor layer 5 to achieve luminescence. Luminescence is obtained when a voltage of a negative potential at the upper cathode 12 and a positive potential at the lower anode 13 is applied. Numerous studies have been conducted in regard to the PN junction from before. An essence of one or more embodiments of the present invention is to make active use of the characteristics of the PN junction in a DC EL device and achieve steady operation. In one or more embodiments of the present invention, stable luminescence of long life can be obtained, the luminescence efficiency can further be improved by one order of magnitude or more in comparison to conventional methods, and a stable, bright luminescence can be obtained.

Figure 2:
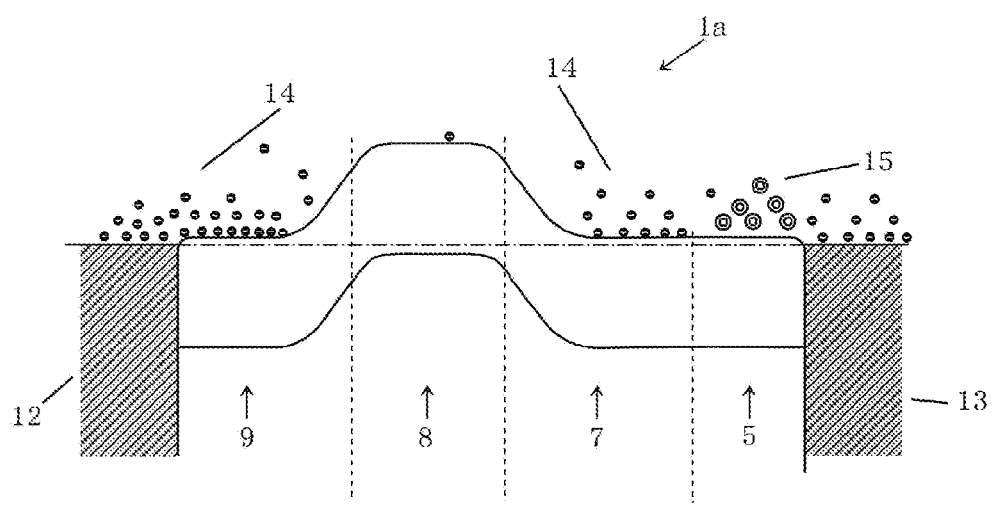
FIG. 2 is a conceptual energy band diagram of the DC-driven inorganic electroluminescence device according to the first embodiment of the claimed invention in a non-operating state.

FIG. 2 is a conceptual energy band diagram of the DC-driven inorganic electroluminescence device 1a according to the present embodiment in a state in which an external voltage is not applied. A left side of the diagram is the cathode 12, a right side of the diagram is the anode 13, and the phosphor layer 15, containing luminescent centers 15, the acceleration layer 7, the P-type semiconductor layer 8, and the N-type semiconductor layer 9 are arranged in between. A Fermi level $E_F$ is constant across the entirety because the applied voltage from the exterior is zero, and the electrons 14 are in a state of thermal equilibrium.

Figure 3:
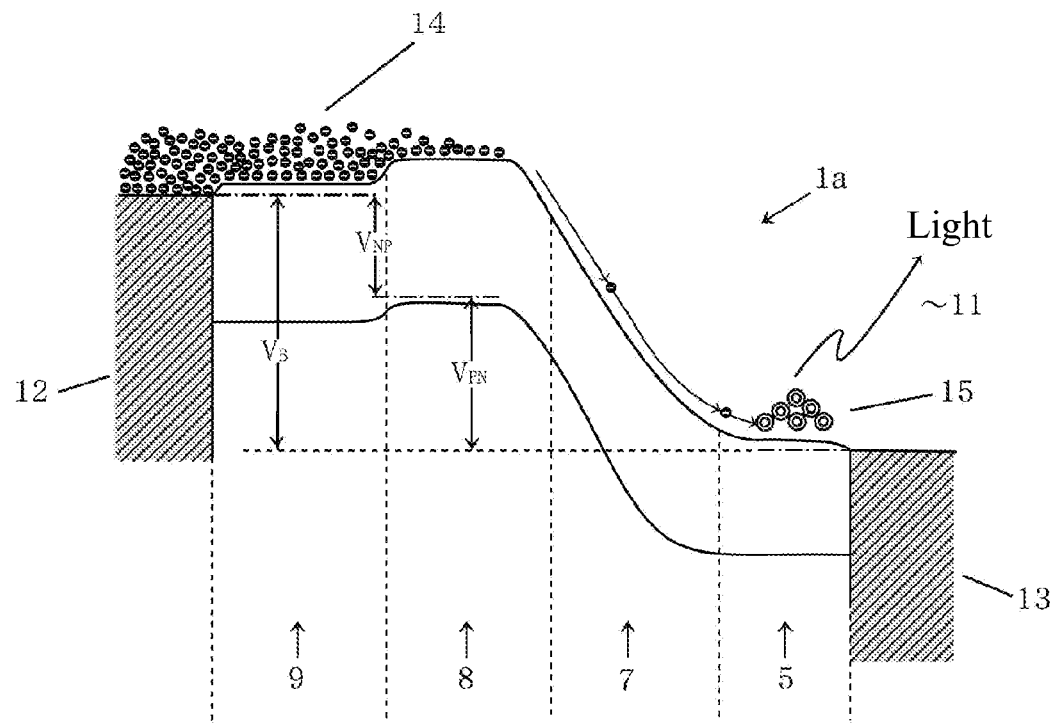
FIG. 3 is a conceptual energy band diagram of the DC-driven inorganic electroluminescence device according to the first embodiment of the claimed invention in an operating state.

FIG. 3 is a conceptual energy band diagram of the DC-driven inorganic electroluminescence device 1a according to the present embodiment in an operating state. The left side of the diagram is the cathode 12, the right side of the diagram is the anode 13, and the semiconductors are arranged in the NPN-type structure when the inorganic electroluminescence device 1a is viewed as a whole. The PN junction is formed by the N-type semiconductor layer 9 at the cathode side and the next P-type semiconductor layer 8 and is biased in the forward direction with respect to an applied voltage $V_B$ from the exterior. By the forward direction current, the electrons 14 from the cathode 12 are injected into the P-type semiconductor layer 8 through the N-type semiconductor layer 9 and diffuse inside the P-type semiconductor layer 8. Consequently, an amount of the electrons 14 injected into the acceleration layer 7, which is the next N-type semiconductor, can be restricted appropriately by balancing the electric field and be controlled to an amount necessary for luminescence. The next PN junction portion (the P-type semiconductor layer 8 and the acceleration layer 7) is reverse-biased with respect to the external voltage, and a large portion of the external voltage $V_B$ is applied to this portion. Consequently, the depletion layer spreads at this junction portion. The electrons 14 injected through the P-type semiconductor layer 8 are accelerated in the depletion layer and generated as hot electrons. The electrons 14 that have thus obtained a high energy collide with and excite the luminescent centers 15 inside the phosphor layer 5 and the luminescence 11 is thereby obtained. This is the mechanism of DC luminescence. In FIG. 3, $V_{NP}$ conceptually expresses a voltage into which the external voltage is distributed between the N-type semiconductor layer 9 and the P-type semiconductor layer 8, and $V_{PN}$ conceptually expresses a voltage distributed between the P-type semiconductor layer 8 and the acceleration layer 7, which is an N-type semiconductor.

A large portion of the energy from the electric field applied from the exterior is thus applied to the depletion layer to enable energy to be transmitted efficiently to the electrons 14, and the luminescence efficiency is thereby increased. With the DC-driven inorganic electroluminescence device according to the present embodiment, a mechanism of luminescence of a cathode ray tube is realized within a semiconductor solid-state substance to perform the processes of injection, acceleration, and collision of the electrons 14 and excitation and luminescence of the luminescent centers.

Figure 4:
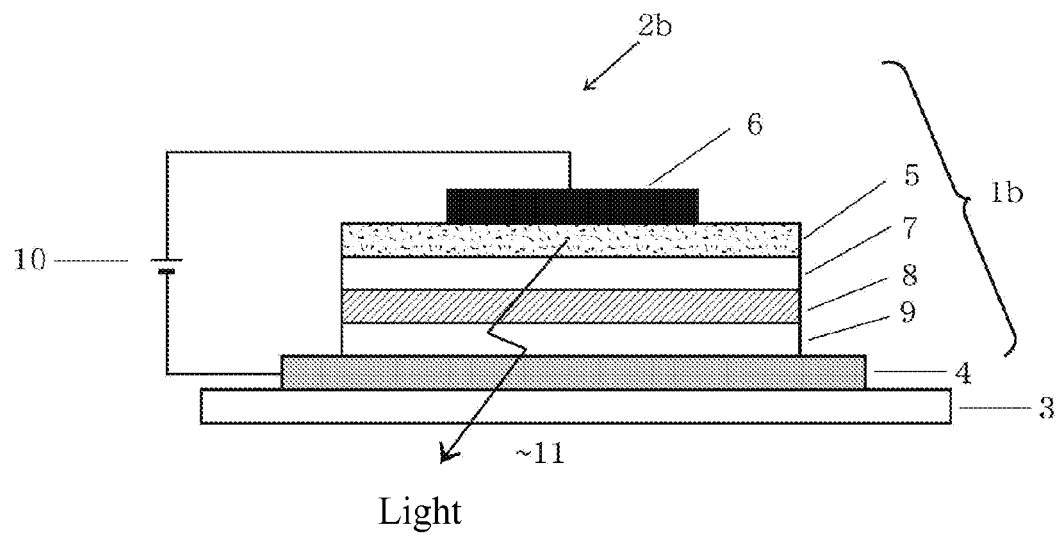
FIG. 4 is a sectional structural view of a DC-driven inorganic electroluminescence device according to a second embodiment (Example 1) of the claimed invention.

A DC-driven inorganic electroluminescence device and a light emitting device and a light emission method that employ the electroluminescence device shall now be described with reference to FIG. 4 as a second embodiment related to a practical structure according to one or more embodiments of the present invention. As shown in FIG. 4, with the DC-driven inorganic electroluminescence device 1b and the inorganic electroluminescence light emitting device 2b according to the present embodiment, first, a lower transparent electrode 4 is prepared on the glass substrate 3. One of either an upper or lower electrode must be made transparent to make the light be emitted to the exterior through a conductive material. As the material for forming the lower transparent electrode 4, ITO, ZnO, AZO, $TiO_2$, $SnO_2$, $In_2O_3$, $ZnSnO_3$, $AgInO_2$, $Zn_2In_2O_5$, $Zn_2Ga_2O_4$, etc., may be considered. These materials are, in themselves, known materials and all are widely and generally known at the time of application of the present invention as materials that make up a transparent electrode, and thus in particular with the present embodiment, preparations and demonstrations related to actions and effects of each material are considered unnecessary and have not been carried out.

Next, the N-type semiconductor layer 9 is a semiconductor that exhibits an N-type property when formed into a thin film, and as the material thereof, an inorganic compound, which exhibits properties of an N-type semiconductor when vapor deposited, can be considered. Specifically, a thin film is formed from an oxide, sulfide, phosphide, nitride, or selenide of Zn, Ba, Sr, Cd, Ga, Sn, In, Ti, Al, Mg, or Gd, or a mixture of these compounds, that is for example, a material such as ZnO, BaO, SrO, CdO, $In_2O_3$, $Ga_2O$, $SnO_2$, TiO, ZnS, BaS, SrS, CdS, $GdIn_2O_4$, $GaInO_3$, $ZnSnO_3$, InP, GaP, AlP, InN, AlN, GaN, SrSe, ZnSe, GaAlS, $MgAl_2S_4$, $MgGa_2S_4$, $SrAl_2S_4$, $SrGa_2S_4$, $BaAl_2S_4$, $BaIn_2S_4$, etc. Here, the material of the N-type semiconductor layer 9 is similar to the material used in the transparent electrode and thus a structure serving in common as the transparent electrode may be considered for this portion. These materials of the N-type semiconductor layer 9 are also are widely and generally known at the time of application of the present invention, and thus, in particular with the present embodiment, preparations and demonstrations related to actions and effects of each material are considered unnecessary and have not been carried out.

Also, as the P-type semiconductor layer 8 at a middle of the NPN-type layer, a semiconductor, which is an oxide, sulfide, or selenide of Ni, Mn, Cr, Co, Cu, Ag, La, Pr, Al, Ga, Sr, Ba, or Sn, or a mixture of these compounds and exhibits P-type properties when formed into a thin film, is used. For example, NiO, NiO:Li, MnO, $Cr_2O_3$, CoO, $Ag_2O$, $Pr_2O_3$, SnO, $Cu_2O$, $CuInO_2$, $SrCu_2O_2$, $CuAlO_2$, $BaCu_2O_2$, $CuGaO_2$, $LaCuOS$, $LaCuOSe$, etc., may be used. A material, obtained by making a compound semiconductor, such as ZnO, etc., into a P-type material by doping with nitrogen as an impurity, may also be used. These materials of the P-type semiconductor layer 8 are also widely and generally known at the time of application of the present invention, and thus, in particular with the present embodiment, preparations and demonstrations related to actions and effects of each material are considered unnecessary and have not been carried out.

Next, the acceleration layer 7, which is an N-type semiconductor, is related to the phosphor layer 5 and is made from the same in material as the host material of the phosphor layer 5. This portion is used to form the acceleration layer 7 for accelerating the electrons. The materials listed above as the materials for the N-type semiconductor layer 9 may be used. Specifically, an inorganic compound that exhibits properties of an N-type semiconductor when vapor-deposited is used, and an oxide, sulfide, phosphide, nitride, or selenide of Zn, Ba, Sr, Cd, Ga, Sn, In, Ti, Al, Mg, or Gd, or a mixture of these compounds, for example, ZnO, BaO, SrO, CdO, $In_2O_3$, $Ga_2O$, $SnO_2$, TiO, ZnS, BaS, SrS, CdS, $GdIn_2O_4$, $GaInO_3$, $ZnSnO_3$, InP, GaP, AlP, InN, AlN, GaN, SrSe, ZnSe, $MgAl_2S_4$, $MgGa_2S_4$, $SrAl_2S_4$, $SrGa_2S_4$, $BaAl_2S_4$, $BaIn_2S_4$, etc., may be used. Demonstrations regarding these materials have also not been performed and the reasons are the same as those given above.

In order to efficiently accelerate the electrons 14 injected through the P-type semiconductor layer 8, the acceleration layer 7 must be made an N-type semiconductor thin film of high crystallinity with as few defects as possible. This portion functions as the acceleration layer for the electrons 14, and by the internal electric field formed by the P-type semiconductor layer 8 and this N-type semiconductor layer (acceleration layer 7), the electrons 14 injected through the P-type semiconductor layer 8 are accelerated efficiently and a large energy is transferred to the electrons.

Next, with the phosphor layer 5, a phosphor or luminescent centers 15 is or are dispersed finely and embedded in the same substance as that of the N-type semiconductor for acceleration (acceleration layer 7). Examples of the phosphor or luminescent centers include fluorescent substances, such as ZnS:Mn, ZnS:Tb, ZnS:Sm, ZnS:Pr, ZnS:Dy, ZnS:Eu, ZnS:Cu,Cl, ZnS:Ag,Cl, ZnS:Pr,Ir, SrS:Ce, SrS:Mn, ZnF:Gd, ZnO:Zn, ZnO:Sm, ZnO:Pr, ZnO:Dy, ZnO:Eu, $Y_2O_3$:Eu, $Y_2O_3$:Mn, $GaO_3$:Eu, $Ga_2O_3$:Mn, $Y_2GeO_5$:Mn, $CaGa_2O_4$:Mn, $Zn_2SiO_4$:Mn, $BaAl_2S_4$:Eu, $SrGa_2S_4$:Ce, ZnMgS:Mn, GaS:Eu, $TbF_3$, $SmF_3$, $PrF_3$, $MnF_3$, etc. As the phosphor layer, such luminescent centers or phosphor are or is dispersed in the N-type semiconductor. These are examples, and not only the phosphors listed here but other phosphors may be used to obtain an intended luminescence color. In a composition formula of a phosphor such as those listed above, the substance indicated at the left side of the colon (:) is a crystal host (host material) and the substance indicated at the right side is an activating agent.

A metal, such as Al, Au, cu, Ag, Ni, Pt, etc., is vapor deposited as the upper back surface electrode 6 that is lastly installed at the top, and the inorganic electroluminescence device 1b is thereby completed. Here, if the inorganic electroluminescence device 1b is to be finished to be transparent as a whole, the upper back surface electrode 6 is made of a transparent substance, such as ITO, ZnO, AZO, $Zn_2In_2O_5$, $In_2O_3$, $TiO_2$, $SnO_2$, etc., instead of a metal, and, if the device is to be finished to that of high contrast, an oxide of Mo, Ta, Ti, etc. is vapor deposited to finish the upper back surface electrode 6 to a black electrode. By applying a positive potential to the upper back surface electrode 6 and a negative potential to the lower transparent electrode 4 of the inorganic electroluminescence device 1b thus prepared, luminescence is obtained from the phosphor layer 5.

With the DC-driven inorganic electroluminescence device and light emission method according to one or more embodiments of the present invention, luminescence is obtained with a DC power supply and thus a driving apparatus is made simple and a display device, etc., can be manufactured at a low price overall. Also, the inorganic electroluminescence device is arranged in a solid state as whole and is strong against external mechanical forces. Further, the inorganic electroluminescence device is made entirely of inorganic substances and thus, in comparison to an organic EL device, operates normally even when an ambient temperature is high. Material costs can be held low because expensive materials are not used, and the inorganic electroluminescence device does not require special apparatuses and special skills to manufacture, is inexpensive in terms of manufacturing equipment, and can be prepared by known manufacturing techniques. The self-luminescent inorganic electroluminescence device has a thickness of only several dozen μm as a whole, enables preparation of a thin display device, and, in case of use as a display device, does not require a backlight, polarizer plate, etc. as in a liquid crystal, is simple in structure, and advantageous in terms of price. Due to being an inorganic EL device with which the principle of luminescence is collisional excitation, the luminescence color can be adjusted as suited by consideration of the substance of the luminescent centers or the phosphor. The inorganic electroluminescence device according to one or more embodiments of the present invention thus has numerous merits and has future possibilities of utilization not only in display devices, but also, in illumination, etc., and particularly in planar light sources. As described above, by the inorganic electroluminescence device according to one or more embodiments of the present embodiment, a self-luminescent device of high luminescence efficiency that can be driven by a DC power supply can be provided by introduction of a semiconductor NPN-type structure in the interior of the inorganic electroluminescence device. Also, any of numerous, well-known phosphors that are present today can be used as the light emitting material, making it possible to freely control the luminescence color as desired.

A DC-driven inorganic electroluminescence device according to a third embodiment of the present invention shall now be described with reference to FIG. 5, FIG. 6, and FIG. 11. With the inorganic electroluminescence device according to one or more embodiments of the present invention, electrons are accelerated in the interior of the acceleration layer by an electric field applied from the exterior and are made to collide with the luminescent centers to obtain luminescence. The electrons supplied from the cathode side are accelerated toward the anode side by the internal electric field. Upon receiving the energy necessary for luminescence, the electrons collide with and excite the luminescent centers to emit light. Thus, with the inorganic electroluminescence device, the electrons are accelerated and made to collide with the luminescent centers by the electric field applied to the interior. The greater the voltage applied, the greater the energy of the electrons and the stronger the light emitted to the exterior. For this, a greater application voltage is necessary. However, the inorganic electroluminescence device uses a semiconductor material in the phosphor layer and has the NPN-type internal structure, and thus as the applied voltage is increased, current begins to flow suddenly from a certain voltage and the current increases greatly with increase of applied voltage.

That is, with respect to a variation of voltage, the device is sensitive and the current that flows through the interior varies greatly. Also, in preparing the inorganic electroluminescence device, a thin-film device structure is arranged using a sputtering apparatus, vapor deposition apparatus, etc. Therefore, a high possibility exists of formation of differences in film thickness and impurities and other defects in the thin film in the manufacturing process, and further, pointed portions may be formed locally. When electrodes are mounted and a high voltage is applied in such a state, breakdown occurs starting from a portion that is electrically weak and from this portion, the breakdown portion spreads in a chain-reaction-like manner. This trend is especially strong in a case of a voltage-driven type inorganic EL device. A first demerit of a thin-film inorganic electroluminescence device is that, when in preparing the device, a device of wide area is prepared, a film thickness difference is likely to occur between a central portion and an end portion of the device. A film thickness difference acts strongly on the internal electric field strength and has a large influence on luminescence intensity, especially with a voltage-driven type device.

Next, as a second problem, the voltage-driven type inorganic electroluminescence device has a property such that an electric field tends to concentrate at an end portion, especially, a tip portion of a metal electrode or a conductive transparent electrode, and dielectric breakdown tends to occur readily at this portion. These phenomena are disadvantageous phenomena for voltage-driven type devices and are manifested as a luminance non-uniformity of luminescence. This is a basic physical problem and is an unavoidable phenomenon, and breakdown tends to occur from this portion when the applied voltage is increased. Although the first film-thickness problem can be resolved to some degree by the manufacturing apparatus, the second problem is a basic physical problem that is extremely difficult to eliminate.

As a third problem, there is a high possibility that impurities and defects are contained inside thin films because in preparing the compound semiconductor or insulator, etc. in the interior, these are made into thin films using a vacuum vapor deposition apparatus or a sputtering apparatus. Pointed portions may also be formed locally. When electrodes are mounted to a portion in such a state and a high voltage is applied, breakdown occurs starting from a portion that is electrically weak and from this portion, the breakdown portion spreads in a chain-reaction-like manner. Further, the electric field tends to concentrate at such impurities, pointed portions, and other defects and a high electric field portion is formed locally. Locally bright portions and dark portions are thus formed. Luminance non-uniformity is undesirable for a planar light source. At the same time, such a portion tends to be weak electrically and invites lowering of the breakdown voltage of the device. In the case of an inorganic electroluminescence device, when a voltage is applied to make a wide area emit light, breakdown occurs more quickly at a portion of thin film thickness or a portion with impurity or other defect than at other portions, and the breakdown at that portion propagates to the other portions. When breakdown begins to occur locally at such a weak portion, the breakdown tends to spread in a chain-reaction-like manner to the other portions, and once breakdown begins, this leads to catastrophic breakdown of the entire device and an unrecoverable state is entered. The breakdown voltage of the entire device is thus determined by a minimum breakdown voltage of such a localized portion.

Figure 5:
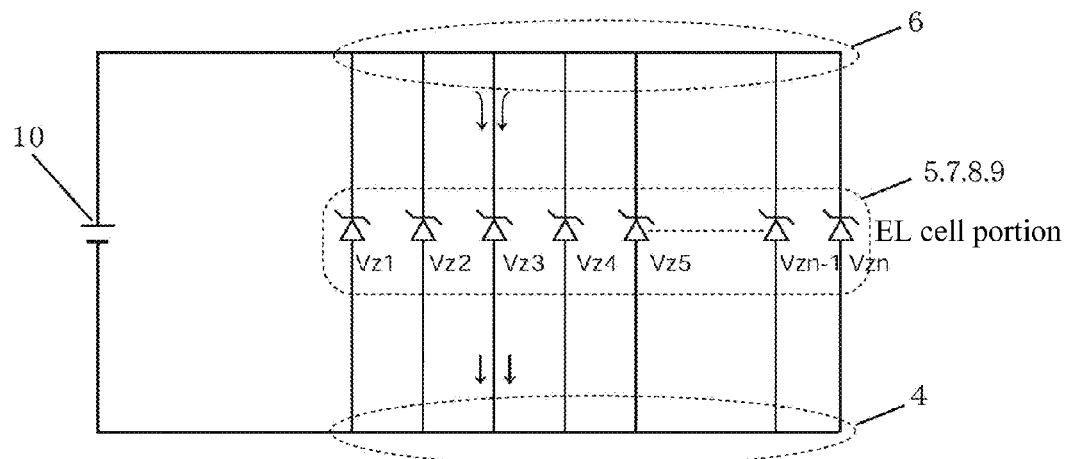
FIG. 5 is an equivalent circuit diagram of the DC-driven inorganic electroluminescence device according to Example 1 of the claimed invention.
Figure 6:
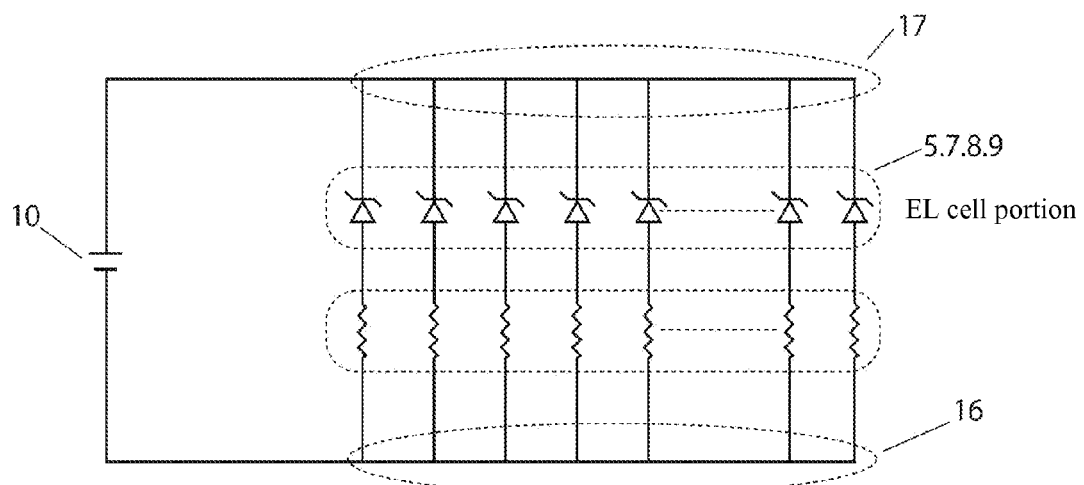
FIG. 6 is an equivalent circuit diagram of a DC-driven inorganic electroluminescence device according to Example 4 of the claimed invention.

To describe this state with an electrically equivalent circuit, a basic inorganic electroluminescence device for surface emission can be considered to be in a state where numerous electroluminescence cell portions are aligned in parallel with respect to a driving power supply as shown in FIG. 5. This is the same as a state in which Zener diodes are aligned in a single column. When in this state, a Zener voltage Vz of a certain portion is low, current concentrates at that portion and this leads to breakdown of the device. When local portions of the inorganic electroluminescence cell portions that are aligned in parallel are compared, all portions are not necessarily uniform. However, the voltage applied from the exterior is applied equally to all portions, and thus with an increase in the applied voltage, a current begins to flow in a concentrated manner at a portion of comparatively low Zener voltage (portion corresponding to Vz3 shown in FIG. 5). Consequently, this weak portion is heated, and due to a property of the semiconductor, even more current flows therethrough. In a final stage, breakdown begins from this portion.

Figure 11:
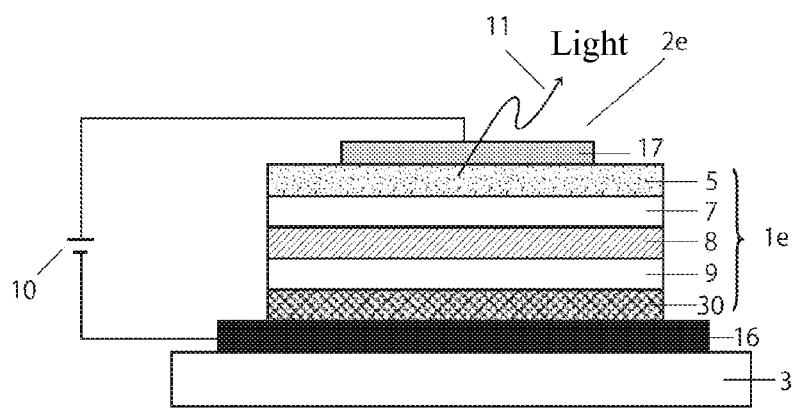
FIG. 11 is a sectional structural view of a DC-driven inorganic electroluminescence device according to Example 4 of the claimed invention.

Thus in order to avoid this problem, with the DC-driven inorganic electroluminescence device according to the third embodiment of the present invention, a resistance layer is inserted between the cathode and the electroluminescence cell portions (the phosphor layer 5 and the NPN type semiconductor portion (7 to 9)) as shown in FIG. 11 for the purpose of dispersing the current among the electroluminescence cell portions and the electrodes and to apply an electric field uniformly across a wide surface. Hereinafter, the resistance layer shall be referred to as the dispersion resistance layer 30. Although the resistance layer is inserted at the cathode side here, the same actions are provided when the layer is inserted between the cell portions and the anode. With the dispersion resistance layer 30, when a large current flows locally, a voltage drop becomes large in this case and the voltage applied from the exterior to an electroluminescence cell portion at this portion is lightened. Consequently, concentration of voltage to non-uniform portions present in the interior of the inorganic electroluminescence device of wide area is alleviated and a uniform voltage is applied to the device as a whole. To describe this conceptually with an equivalent circuit, the voltage applied from the power supply is distributed in accordance with the variation of characteristics of the respective electroluminescence cell portions by a set of resistors connected in series to the cell portions. The set of resistors corresponds to being the dispersion resistance layer 30, and this is the purpose of the dispersion resistance layer 30 of the DC-driven inorganic electroluminescence device according to the present embodiment. The DC-driven inorganic electroluminescence device according to the embodiment of the present application is prepared as a thin-film device using a sputtering apparatus, EB vapor deposition apparatus, etc., and it is practically impossible technically to manufacture a device with uniform electrical characteristics and without any variation whatsoever. When the diodes with variation are driven in parallel, a localized bias occurs and, in the case of a semiconductor, concentration of current occurs at a certain portion. Consequently, this portion is heated, undergoes thermal runaway, and leads to breakdown. In the case of the inorganic electroluminescence device, the local breakdown spreads to the entirety so that the functions as a device can no longer be served. The dispersion resistance layer 30 is thus inserted in series as shown in FIG. 11. By this dispersion resistance layer 30, the concentration of current can be prevented and the inorganic electroluminescence device can be driven with stability. If a large current flows locally, the voltage drop at the dispersion resistance layer increases, the voltage applied to the electroluminescence cell portion at this portion is lightened, and this portion is thus protected. Although it is thus preferable for the dispersion resistance layer to have a large resistance value, certain conditions that depend on vapor deposition conditions, etc. are concomitant because of the thin film arrangement. If the resistance layer is made too thick, the thin film peels readily and the film itself becomes unstable.

Thus, in order to obtain a certain resistance value with a small thickness, a substance of high resistivity that is close to being an insulator must be inserted to provide a large resistance value. In this case, TaN, $SiO_2$, $Al_2O_3$, etc., is favorably used. These substances can be formed as a resistor device when prepared under certain conditions and are thus used as the material for the dispersion resistor. As the material that can be used, any substance having a property of a resistor device may be used, and an oxide or nitride of Ta, Hf, Ti, Nd, Mo, Zn, Sn, Si, Al, or B, or a mixture of these compounds may be used. For example, an anodized film or thick-film type resistor material, etc., of TaN, $SiO_2$:Pd, $Al_2O_3$:Zn, MN, BN, BO, MoO, $Hf_2O_5$, $Ti_2O_3$, or $Ta_2O_5$ can be used as the dispersion resistor layer 30. By introducing these substances in the dispersion resistance layer 30, influence of heat generation from the device on luminescence is also reduced and, at the same time, stable, uniform luminescence is obtained. With the inorganic electroluminescence device, the luminescence intensity is proportional to the current flowing through the phosphor layer, and thus, the flowing current is appropriately dispersed by the dispersion resistance layer 30 so that the luminescence from the device is also uniformly adjusted. Inorganic electroluminescence devices that have been actually trial-manufactured by the present inventor and light emitting devices and light emission methods employing these devices shall now be described as Example 1 to Example 4.

Example 1

Figure 7:
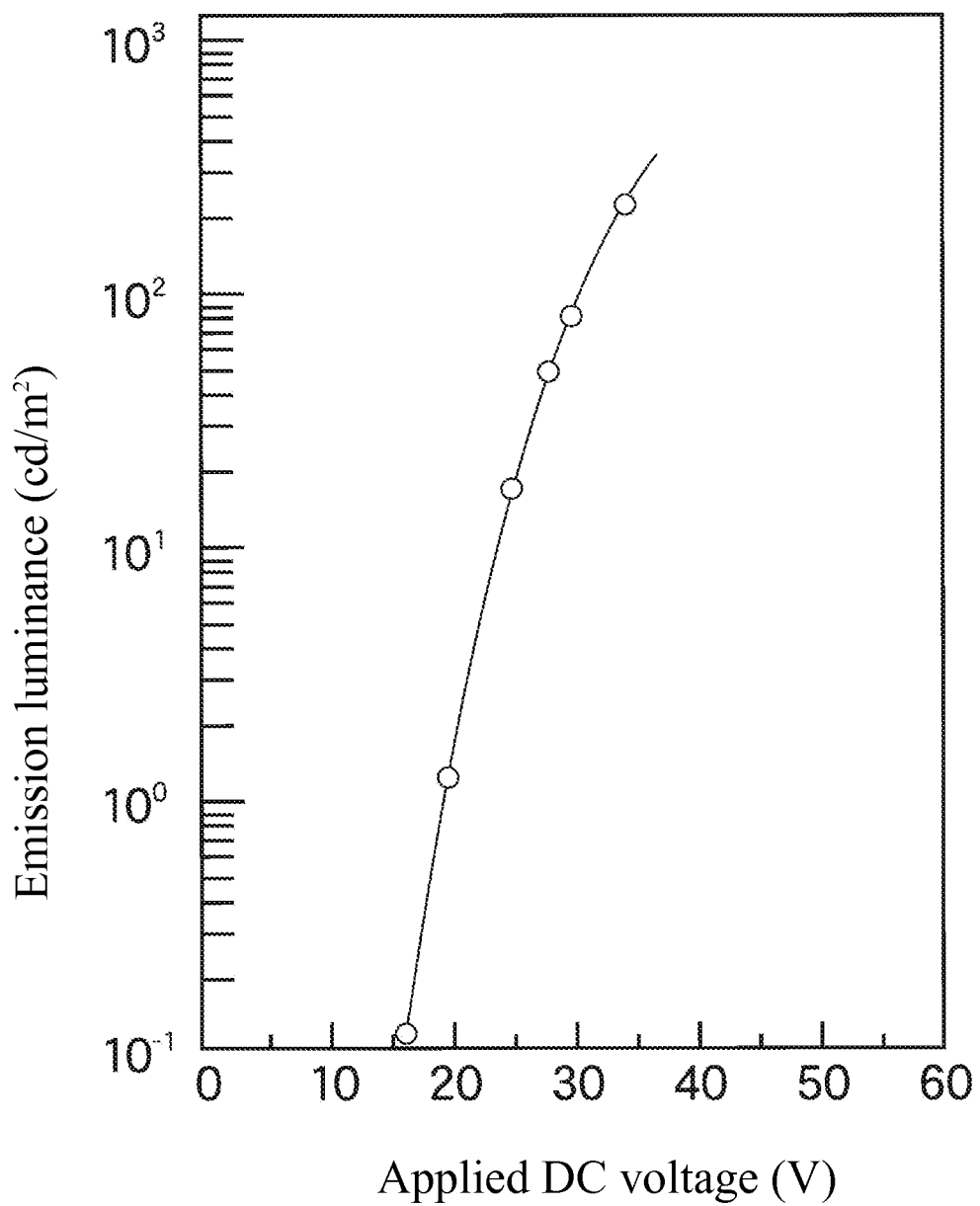
FIG. 7 is a graph of representative applied voltage-emission luminance characteristics of the DC-driven inorganic electroluminescence device according to Example 1 of the claimed invention.

The DC-driven inorganic electroluminescence device 1b, the inorganic electroluminescence light emitting device 2b, and the light emission method using the inorganic electroluminescence device 1b according to Example 1 of the present invention shall now be described with reference to FIG. 4, which has been described above. As shown in FIG. 4, a layer of ZnO is formed as the N-type semiconductor layer 9 on the glass-with-ITO substrate 3 of the lower transparent electrode 4 of the inorganic electroluminescence device 1b. This layer was prepared using Zn metal and utilizing an active sputtering method in an atmosphere of argon and a minute amount of oxygen. As the next P-type semiconductor layer 8, $CuAlO_2$ was formed by the active sputtering method using metal targets of Cu and Al in the argon and oxygen atmosphere. As the N-type semiconductor layer that is to be the acceleration layer 7, sintered pellets of pure ZnS are vapor deposited by an electron beam vapor deposition method (hereinafter referred to as the "EB method"). In the middle of this process, pellets of $TbF_3$ were vapor deposited from a different source at the same time as the luminescent centers. $TbF_3$ is dispersed and mixed as the luminescent centers in a portion of the ZnS layer and this portion is used as the phosphor layer 5. Al metal was then vacuum vapor deposited on an uppermost portion as the upper back surface electrode 6. When with the inorganic electroluminescence light emitting device 2b that employs the inorganic electroluminescence device 1b thus prepared, a positive voltage was applied to the Al electrode (upper back surface electrode 6) and a negative voltage was applied to the lower ITO electrode (lower transparent electrode 4), luminescence of a green color was obtained at approximately 30V. Applied DC voltage and luminescence intensity (emission luminance) characteristics obtained with the DC-driven inorganic electroluminescence device 1b according to Example 1 are shown in FIG. 7. These characteristics were determined by applying a DC voltage with a stabilized power supply to the DC-driven inorganic electroluminescence device according to the example of the present invention and measuring the luminescence. Although a luminescence starting voltage and a maximum luminescence intensity change according to the materials and composition making up the inorganic electroluminescence device and the film thicknesses of the respective layers, FIG. 7 shows representative characteristics of the inorganic electroluminescence according to Example 1.

Figure 8:
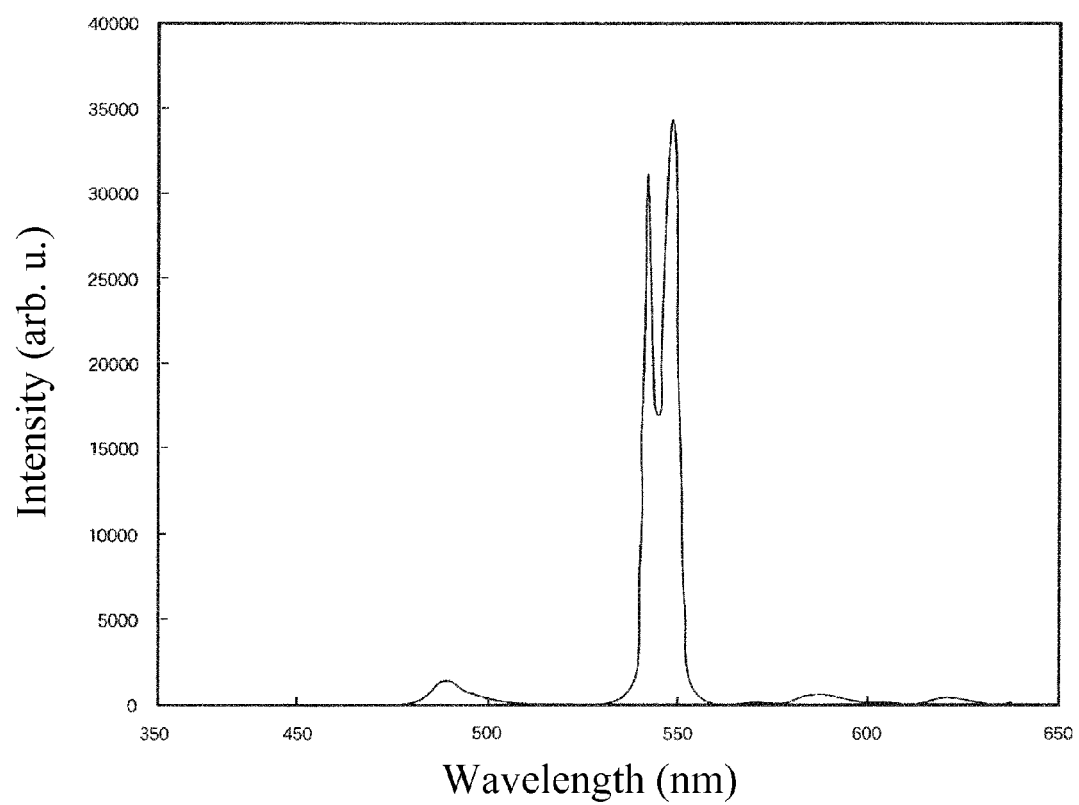
FIG. 8 is a graph of a luminescence spectrum from the DC-driven inorganic electroluminescence device according to Example 1 of the claimed invention.

FIG. 8 is a graph of a luminescence spectrum of the device. The host material forming the phosphor layer 5 of the inorganic electroluminescence device 1b is ZnS, and luminescence having a strong, characteristic peak near 540 to 550 nm is exhibited as the luminescence from $TbF_3$ that is dispersed and mixed in the host material.

Example 2

A DC-driven inorganic electroluminescence device 1d, an inorganic electroluminescence light emitting device 2d, and a light emission method using the inorganic electroluminescence device 1d according to Example 2 of the present invention shall now be described with reference to FIG. 9. The inorganic electroluminescence device 1d according to the present example is a so-called top emission type device.

Figure 9:
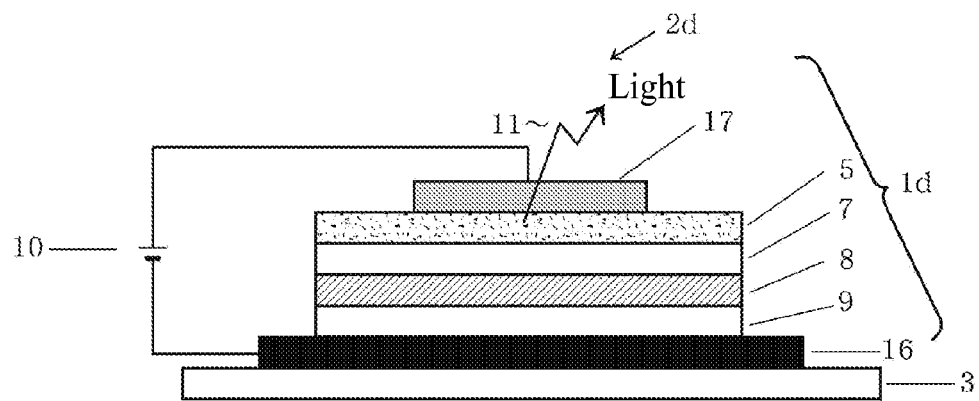
FIG. 9 is a sectional structural view of a DC-driven inorganic electroluminescence device according to Example 2 of the claimed invention.

As shown in FIG. 9, with the DC-driven inorganic electroluminescence device 1d of the present example, a lower metal electrode 16 was prepared on a quartz glass substrate 3 by a DC sputtering method using a Ti metal target. The high melting point substance Ti was used here because heat treatment of the phosphor at a high temperature is required, and W, Mo, Ta, Pt, Ir, or Pd, etc., may also be used. Next, using a Zn metal target, the N-type semiconductor layer 9 of ZnO is formed by using the active sputtering method in the atmosphere of argon and minute amount of oxygen gas. Above this, a thin film of NiO:Li was prepared as the P-type semiconductor layer 8 by an RF magnetron sputtering method using sintered targets of NiO and $Li_2O$ in the mixed gas of argon and minute amount of oxygen. For the N-type semiconductor acceleration layer 7 and the phosphor layer 5, two types of sintered pellets of ZnS and ZnS:$TbF_3$ are prepared and first, a thin film of pure ZnS is vapor deposited as the acceleration layer 7 by the EB method using the ZnS pellets. After this process, the pellets were switched to the ZnS:$TbF_3$ pellets to form the phosphor layer 5. At the point at which the vapor deposition ended, the interior of the vacuum chamber was drawn to high vacuum and heat treatment at 400° C. was performed for 10 minutes. Lastly, using sintered targets of ZnO and $Al_2O_3$, a thin film of ZnO:Al is formed as an upper transparent electrode 17 by the RF magnetron sputtering method in an atmosphere with a minute amount of oxygen, and the top emission type inorganic EL device 1d is thereby completed. With the inorganic electroluminescence light emitting device 2d employing the inorganic electroluminescence device 1d thus prepared, the back surface electrode (upper transparent electrode 17) is transparent to make the light be emitted from the top. When a DC voltage of approximately 40V was applied with the lower metal electrode 16 being negative and the upper transparent electrode 17 being positive, luminescence of a green color due to $TbF_3$ was obtained.

Example 3

Figure 10:
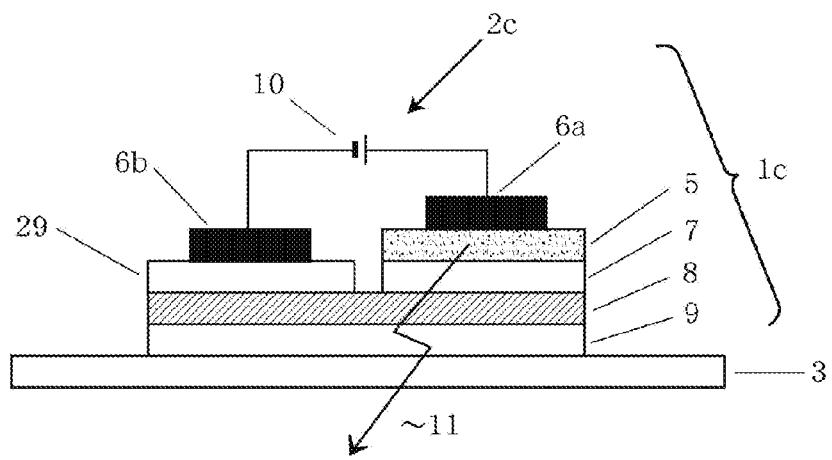
FIG. 10 is a sectional structural view of a DC-driven inorganic electroluminescence device according to Example 3 of the claimed invention.

A DC-driven inorganic electroluminescence device 1c, an inorganic electroluminescence light emitting device 2c, and a light emission method using the inorganic electroluminescence device 1c according to Example 3 of the present invention shall now be described with reference to FIG. 10. In a case where both electrodes are made of metal, the inorganic electroluminescence device 1c must be finished to a lateral type device as shown in FIG. 10 to make the internal fluorescence be emitted to the exterior.

First, using a Zn metal target, a thin film of ZnO is formed as the N-type semiconductor layer 9 on the glass substrate 3 by performing RF magnetron sputtering in a mixed gas atmosphere of Ar and $O_2$. Next, using the two types of sintered targets of SrO and $Cu_2O$, a film of $SrCu_2O_2$ was formed as the P-type semiconductor layer 8 by the EB vapor deposition method. Portions corresponding to an injection layer (the portion (symbol 29) in contact with an upper back surface electrode 6b shall be referred to in particular as the "injection layer") and the acceleration layer 7 were formed by the EB method using pure ZnS pellets. The phosphor layer 5 was formed by partially covering with a metal mask and performing vapor deposition locally by the EB method using ZnS:Mn pellets.

Above this, Al is vapor deposited as upper back surface electrodes 6a and 6b at two locations by a resistive heating vapor deposition method. With the inorganic electroluminescence device 1c, the side at which the film of the ZnS:Mn phosphor layer 5 is present is the positive electrode, and the side in contact with the pure ZnS is the negative electrode. When a DC voltage of approximately 100V was applied to the inorganic electroluminescence light emitting device 2c employing the inorganic electroluminescence device 1c, luminescence of an orange color was obtained from the electroluminescence device.

Example 4

A DC-driven inorganic electroluminescence device 1e, an inorganic electroluminescence light emitting device 2e, and a light emission method using the inorganic electroluminescence device 1e according to Example 4 of the present invention shall now be described with reference to FIGS. 11 to 13. Although as with the inorganic electroluminescence device 1d of Example 2, the inorganic electroluminescence device 1e according to the present example is a top emission type device, the present device has a structure having the dispersion resistance layer 30 disposed in the interior.

First, the lower metal electrode 16 is formed on a glass substrate by performing the sputtering method using a Ta metal target in an argon gas atmosphere. Nitrogen gas was then introduced in the middle of this process to form a thin film of TaN on the surface of the Ta electrode. This film functions as the dispersion resistance film 30. Then, using a Zn metal target, the N-type semiconductor 9 of ZnO is formed as a thin film by the active sputter method in the atmosphere of argon and minute amount of oxygen gas. Then, on the upper surface of this thin film, $CuAlO_2$ was formed as the P-type semiconductor 8 in the same manner as in Example 1 using metal targets of Cu and Al and using the active sputtering method in the atmosphere of argon and minute amount of oxygen gas. To form the N-type semiconductor acceleration layer 7 and the phosphor layer 5, two types of pellets of ZnS and ZnS:Mn are prepared and first, vapor deposition by the EB method is performed using the ZnS pellets to form the acceleration layer 7. After this process, the pellets were switched to the ZnS:Mn pellets to form the phosphor layer 5. Lastly, a semitransparent film of Au is formed as the upper transparent electrode 17 by the resistive heating vapor deposition method, and the top emission type inorganic electroluminescence device 1e is thereby completed.

Figure 12:
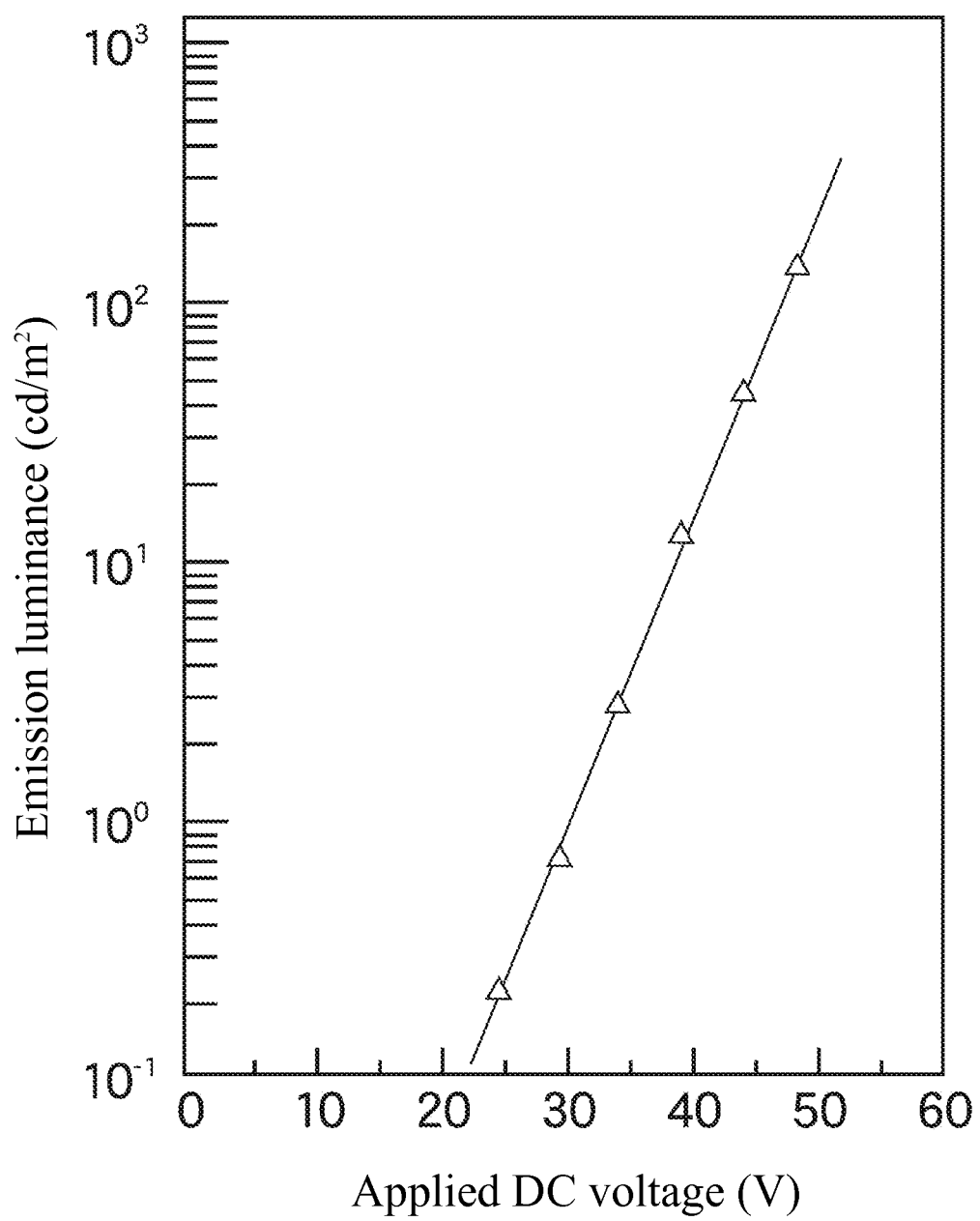
FIG. 12 is a graph of representative applied voltage-emission luminance characteristics of the DC-driven inorganic electroluminescence device according to Example 4 of the claimed invention.
Figure 13:
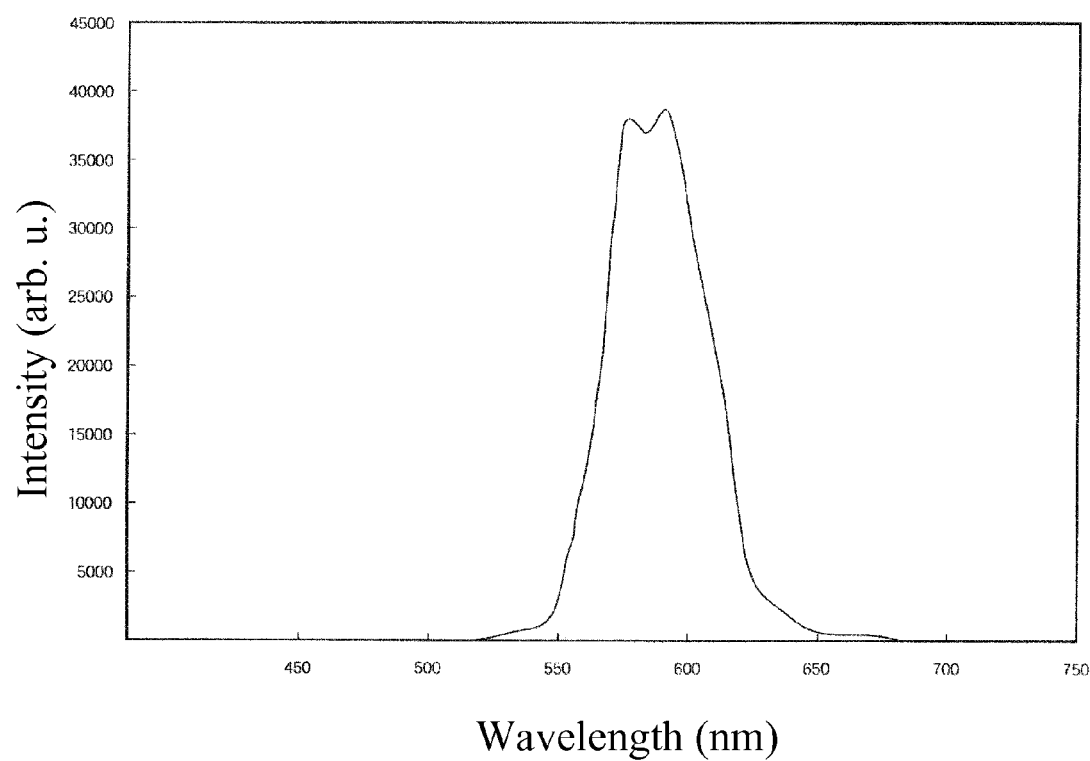
FIG. 13 is a graph of a luminescence spectrum from the DC-driven inorganic electroluminescence device according to Example 4 of the claimed invention.
Figure 14:
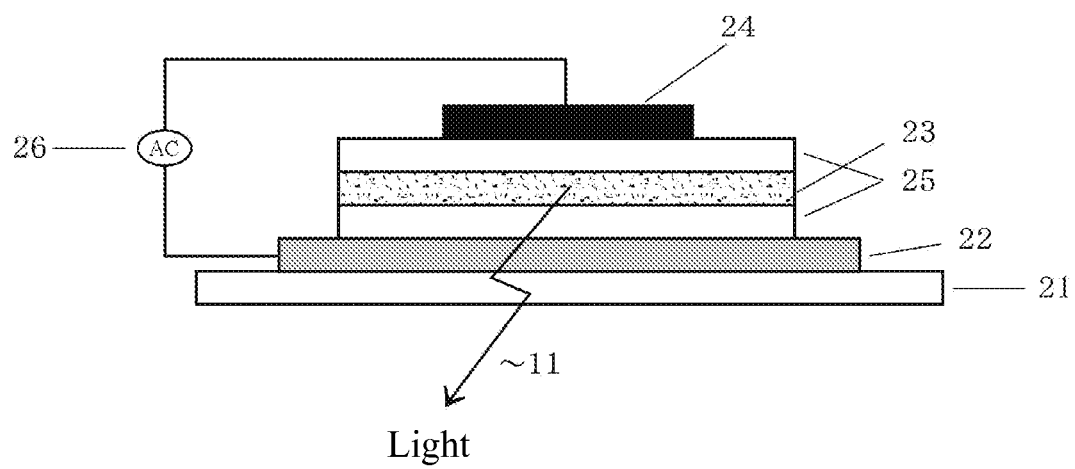
FIG. 14 is a sectional structural view of a conventional AC-driven, thin-film EL device that is put to practical use.
Figure 15:
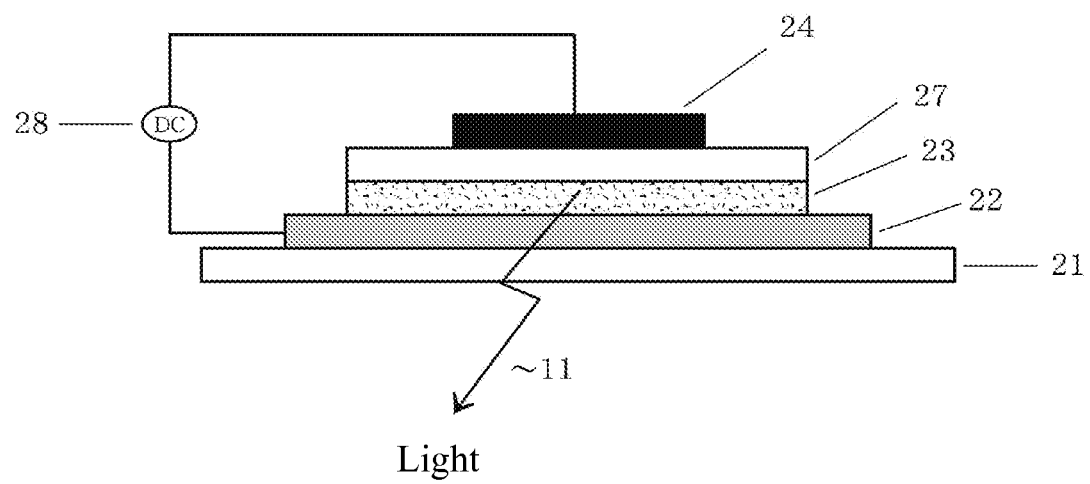
FIG. 15 is a sectional structural view of a conventional DC-driven, thin-film EL device.

By voltage application with the upper transparent electrode 17 being positive and the lower metal electrode 16 being negative, a relationship of applied voltage and luminescence intensity shown in FIG. 12 was obtained. The luminescence color in this case was that of luminescence from Mn, and an orange color tone having a peak near 570 to 600 nm as shown in FIG. 13 was obtained.

In the four examples described above, ZnO or ZnS is used as the N-type semiconductor layer 9, $CuAlO_2$, NiO:Li, or $SrCu_2O_2$ is used as the P-type semiconductor layer 8, and ZnS is used as the N-type semiconductor layer that is the acceleration layer 7. Although these materials are a portion of all of the materials (substances) mentioned above, all of the aforementioned materials (substances) are individually known materials (substances) and the present invention has sufficient feasibility even when put into practice by combining any of these materials (substances).

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

INDUSTRIAL APPLICABILITY

As described above, each of the inventions described in the first to seventh aspects of embodiments of the present invention is widely applicable as a DC-driven inorganic electroluminescence device or a light emission method in a backlight device for a liquid crystal, a display device used in a television or a monitor, or other illumination device for industrial or general household use. In particular, the electroluminescence device and light emitting device are long in life and employ inorganic substances and are thus industrially applicable under severe environmental conditions that require lowering of a frequency of replacement.

DESCRIPTION OF REFERENCE CHARACTERS 1a to 1e: Inorganic electroluminescence device
2a to 2e: Inorganic electroluminescence light emitting device
3: Glass substrate
4: Lower transparent electrode
5: Phosphor layer
6, 6a, 6b: Upper back surface electrode
7: Acceleration layer (N-type semiconductor layer)
8: P-type semiconductor layer
9: N-type semiconductor layer
10: DC power supply
11: Luminescence
12: Cathode
13: Anode
14: Electron
15: Luminescent center
16: Lower metal electrode
17: Upper transparent electrode
21: Glass substrate
22: Lower transparent electrode
23: Phosphor layer
24: Upper back surface electrode
25: Insulating layer
26: AC power supply
27: Stabilizing layer
28: DC power supply 29: Injection layer
30: Dispersion resistance layer

What is claimed is:

1. A DC-driven inorganic electroluminescence device comprising:
   a structure comprising a phosphor layer sandwiched between a first electrode and a second electrode; and
   a semiconductor structure in which a first N-type semiconductor, a P-type semiconductor, and a second N-type semiconductor, made of inorganic semiconductor materials, are joined to form an NPN type structure,
   wherein the phosphor is made of an inorganic substance,
   wherein the first electrode is to be a cathode and is formed on an insulating glass substrate,
   wherein the second electrode is to be an anode and is disposed opposite the first electrode, and
   wherein, in the following order, the cathode, the first N-type semiconductor, the P-type semiconductor, the second N-type semiconductor, the phosphor layer, and the anode are disposed.

2. The DC-driven inorganic electroluminescence device according to claim 1,
   wherein the phosphor layer is formed of a film in which luminescent centers are dispersed and mixed in the N-type semiconductor material, or a fluorescent substance is dispersed and mixed in the N-type semiconductor material.

3. The DC-driven inorganic electroluminescence device according to claim 1,
   wherein the material of the N-type semiconductor at the cathode side in the semiconductor structure joined to form the NPN type structure is made of an oxide, sulfide, phosphide, nitride, or selenide of Zn, Ba, Sr, Cd, Ga, Sn, In, Ti, Al, Mg, or Gd, or a mixture of these compounds.

4. The DC-driven inorganic electroluminescence device according to claim 1,
   wherein the material of the P-type semiconductor present in a middle of the semiconductor structure joined to form the NPN type structure is made of an oxide, sulfide, or selenide of Ni, Mn, Cr, Co, Cu, Ag, La, Pr, Al, Sr, Ga, Ba, or Sn, or a mixture of these compounds.

5. The DC-driven inorganic electroluminescence device according to claim 1,
   wherein the material of the N-type semiconductor adjacent the phosphor layer in the semiconductor structure joined to form the NPN type structure is made of an oxide, sulfide, phosphide, nitride, or selenide of Zn, Ba, Sr, Cd, Ga, Sn, In, Ti, Al, Mg, or Gd, or a mixture of these compounds.

6. The DC-driven inorganic electroluminescence device according to claim 1, further comprising a dispersion resistance layer disposed between the first electrode and the second electrode and formed as a thin film of a resistor substance containing an inorganic compound made of at least one type of substance selected from among Ta, Hf, Ti, Nd, Mo, Sn, Zn, Si, Al, and B.

* * * * *